US012641749B2

(12) United States Patent
Defretin et al.

(10) Patent No.: US 12,641,749 B2
(45) Date of Patent: May 26, 2026

(54) HIGH RELIABILITY, LOW COST ELECTRONICS IN OIL FOR SUBSEA APPLICATIONS

(71) Applicant: Schlumberger Technology Corporation, Sugar Land, TX (US)

(72) Inventors: Harmel Defretin, Sugar Land, TX (US); Lionel Beneteau, Clamart (FR); Romain Juteau, Clamart (FR); Khaled Elshawarby, Stonehouse (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 204 days.

(21) Appl. No.: 18/489,033

(22) Filed: Oct. 18, 2023

(65) Prior Publication Data

US 2024/0130075 A1      Apr. 18, 2024

Related U.S. Application Data

(60) Provisional application No. 63/379,930, filed on Oct. 18, 2022.

(51) Int. Cl.
H05K 7/20              (2006.01)

(52) U.S. Cl.
CPC ................................ H05K 7/20236 (2013.01)

(58) Field of Classification Search
CPC ........... H05K 7/20236; H05K 7/20218; H05K 7/20536; H05K 7/20627; H05K 7/20709; H05K 7/20763; H05K 7/20845; H05K 7/20872; H05K 7/2089; H05K 7/20927
See application file for complete search history.

(56) References Cited

U.S. PATENT DOCUMENTS

| | | | | |
|---|---|---|---|---|
| 10,264,711 B2 * | 4/2019 | Dehlsen | ............ | H05K 7/20754 |
| 10,480,776 B1 * | 11/2019 | Fultz | .................... | F21V 31/005 |
| 11,202,395 B1 * | 12/2021 | Mulcahy | ............... | H05K 7/209 |
| 12,171,082 B2 * | 12/2024 | Tokuda | ............... | H05K 7/20272 |
| 2009/0303687 A1 * | 12/2009 | Davis | ................... | H05K 7/1439 |
| | | | | 361/752 |
| 2012/0314373 A1 * | 12/2012 | Park | .................... | H05K 7/1434 |
| | | | | 361/715 |
| 2015/0354902 A1 * | 12/2015 | McDonald | ......... | H05K 7/14337 |
| | | | | 165/45 |
| 2017/0223849 A1 * | 8/2017 | Skarboe | ............ | H05K 7/14337 |

* cited by examiner

*Primary Examiner* — Jayprakash N Gandhi
*Assistant Examiner* — Matthew Sinclair Muir
(74) *Attorney, Agent, or Firm* — Jeffrey D. Frantz

(57) ABSTRACT

Embodiments presented provide for high reliability and low cost electronics used in hydrocarbon recovery operations. In embodiments, the low cost electronics are used in subsea applications.

15 Claims, 2 Drawing Sheets

HIGH RELIABILITY, LOW COST ELECTRONICS IN OIL FOR SUBSEA APPLICATIONS

CROSS-REFERENCE TO RELATED APPLICATIONS

This application claims priority to U.S. Patent Application Ser. No. 63/379,930, entitled: "High Reliability, Low Cost Electronics in Oil for Subsea Applications", filed on Oct. 18, 2022, the entirety of which is incorporated herein by reference.

FIELD OF THE DISCLOSURE

Aspects of the disclosure relate to electronics used in hydrocarbon recovery operations. More specifically, aspects of the disclosure relate to high reliability and low cost electronics used in subsea applications for hydrocarbon recovery operations.

BACKGROUND

For subsea applications, enclosures, called an SEM, may hold electronics, wherein the SEM is filled with nitrogen and sealed. The SEM, in turn, is enclosed in a SCM enclosure, that is filled with oil for cooling purposes. The whole assembly is resting on the seabed and carry out seabed operations.

The whole subsea assembly needs to be highly reliable and must provide a mission profile of 20 years because economic costs over 1 M$ are needed just to prepare the intervention to change parts within the SCM. Secondly the electronics in the SEM enclosure are filled with nitrogen in order to control the atmosphere and the to get rid of humidity. The whole assembly is then sealed and has to be immersed in pressurized oil. Therefore, the enclosure manufacturing is complex and the SEM wall thickness has to be designed as such to withstand the pressure from the oil. The pressurized oil is used to dissipate the heat generated from the electronics within the SEM (Nitrogen is not a good heat conductor).

There is a need to provide an apparatus and methods that easier to operate than conventional apparatus and methods.

There is a further need to provide apparatus and methods that do not have the drawbacks discussed above, namely of humidity build up within critical electrical components.

There is a still further need to reduce economic costs associated with operations and apparatus described above with conventional tools.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In another example embodiment, an arrangement is disclosed. The arrangement may comprise a shell comprising an internal volume, the shell having a first end and a second end. The arrangement may also comprise an electrical connection end connected to the first end of the shell, the electrical connection end configured to transmit electricity and signals. The arrangement may also comprise an electronics rack positioned within the internal volume, the electronics rack configured to support electrical equipment and an end cap positioned at the second end of the shell, wherein a combination of the shell, the electrical connection and the end cap is configured to store oil within the combination.

Another example embodiment of the disclosure provides a method. The method may comprise obtaining a shell with a first end and a second end and installing electrical equipment within the shell. The method may also comprise installing an end cap at the second end of the shell. The method may also comprise installing an electrical connection end at first end of the shell and filling the shell with oil.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the drawings. It is to be noted, however, that the appended drawings illustrate only typical embodiments of this disclosure and are therefore not be considered limiting of its scope, for the disclosure may admit to other equally effective embodiments.

Figures 1A, 1B:
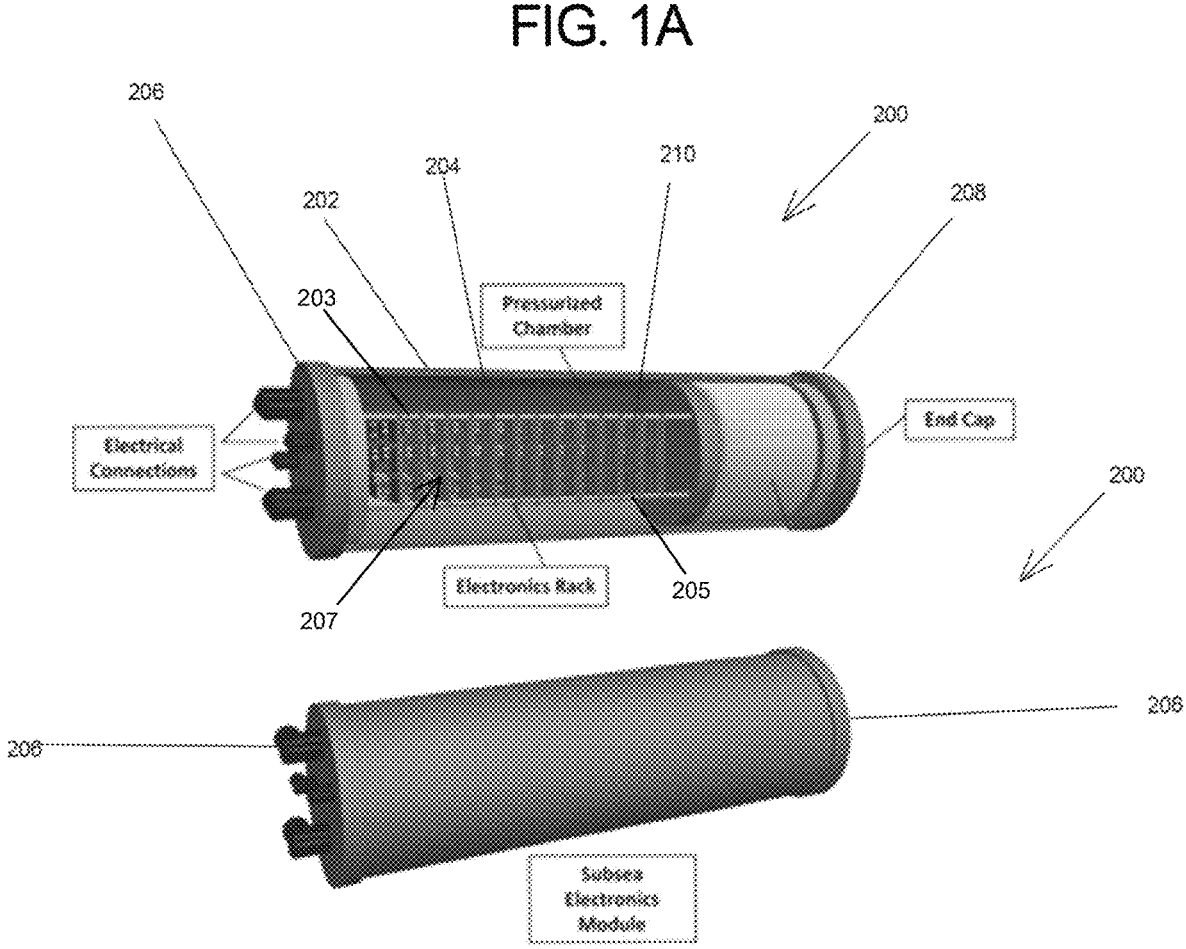
FIG. 1A is a cross-sectional view of one aspect of the disclosure with an internal electronics rack.
FIG. 1B is an external view of the arrangement of FIG. 1A.

To facilitate understanding, identical reference numerals have been used, where possible, to designate identical elements that are common to the figures ("FIGS"). It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the claims except where explicitly recited in a claim. Likewise, reference to "the disclosure" shall not be construed as a generalization of inventive subject matter disclosed herein and should not be considered to be an element or limitation of the claims except where explicitly recited in a claim.

Although the terms first, second, third, etc., may be used herein to describe various elements, components, regions, layers and/or sections, these elements, components, regions, layers and/or sections should not be limited by these terms. These terms may be only used to distinguish one element, components, region, layer or section from another region, layer or section. Terms such as "first", "second" and other numerical terms, when used herein, do not imply a sequence or order unless clearly indicated by the context. Thus, a first element, component, region, layer or section discussed herein could be termed a second element, component, region, layer or section without departing from the teachings of the example embodiments.

When an element or layer is referred to as being "on," "engaged to," "connected to," or "coupled to" another element or layer, it may be directly on, engaged, connected, coupled to the other element or layer, or interleaving elements or layers may be present. In contrast, when an element is referred to as being "directly on," "directly engaged to," "directly connected to," or "directly coupled to" another element or layer, there may be no interleaving elements or layers present. Other words used to describe the relationship between elements should be interpreted in a like fashion. As used herein, the term "and/or" includes any and all combinations of one or more of the associated listed terms.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details, and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Referring to FIG. 1, an arrangement 200 in conformance with one example embodiment of the disclosure is illustrated. The arrangement 200 is a high reliability component that allows for electrical equipment stored inside the arrangement 200 to be fed electrical energy and transmit data from within the arrangement 200. The arrangement 200 is filled with oil, compared to nitrogen for conventional devices. More details of the arrangement 200 are discussed in relation to FIGS. 2A and 2B below.

Referring to FIG. 1A, an arrangement 200 of one example embodiment of the disclosure. The arrangement 200 is used as an SEM, as discussed above. The arrangement 200 is configured with a shell 202 that defines an internal volume 204. In the illustrated embodiment, the shell 202 is formed in a shape of a closed cylinder. At a first end 206, a set of electrical connections is provided for the shell 202. At a second end 208, an end cap is provided. At 210, an electronics rack is provided to support electronic equipment 207 held within the shell 202. The electronics rack may include a first elongate member 203 and a second elongate member 205 extending longitudinally and entirely through the internal volume 204 from the first end 206 to the second end 208 and spaced apart from one another. The electronic equipment 207 may be spaced apart and extend between, and couple to, the first elongate member 203 and the second elongate member 205. Components stored on the electronics rack 210 are fed electricity from the electrical connections at the first end 206. The electrical connections allow for passing electrical energy to and from the interior of the shell as well as data in the form of signals generated by measuring equipment stored in the arrangement. In the interior of the shell 202, the internal volume 204 may be a pressurized chamber.

Referring to FIG. 1B, the arrangement 200 disclosed in FIG. 1A is illustrated. As provided, the penetrations to the shell 202 are located at the first end 206. In embodiments, the shell 202 may be made of carbon steel, aluminum and titanium in non-limiting embodiments.

In embodiments, the arrangement 200 is filled with oil instead of nitrogen. This has several benefits:

1—To be able to dissipate the heat and not to have the mechanical assembly of the SEM too complex with the design of the heatsinks of critical parts of the electronics 2—Simplify the assembly process of the SEM, since it won't need to be sealed with Nitrogen.

3—Decrease the thickness of the SEM in order to allow more room for additional Electronics (higher power density)

In embodiments, several advantages are provided. In the embodiments is enclosed, there is an increasing power density which is today limited by the heat rise of the components in the SEM enclosure and the thickness of the SEM wall High cost of the mechanical assembly Using oil as a heat dissipation medium, that will cool the electronics down as it is no longer relying on natural convection to Nitrogen (bad heat conductivity) but to oil which is an excellent heat conductor Since it is no longer sealed, the wall thickness can be reduced just to hold the electronics in place but there is no mechanical need to have a thick wall to withstand the pressure Electronics in oil will protect the parts from moisture and degassing (which happens over time)

In embodiments, the capability of the arrangement 200 provides a service life of 25 years at 400 bars exposure at 85 degrees C. Conventional apparatus do not have such long life capability coupled with low construction cost.

Figure 2:
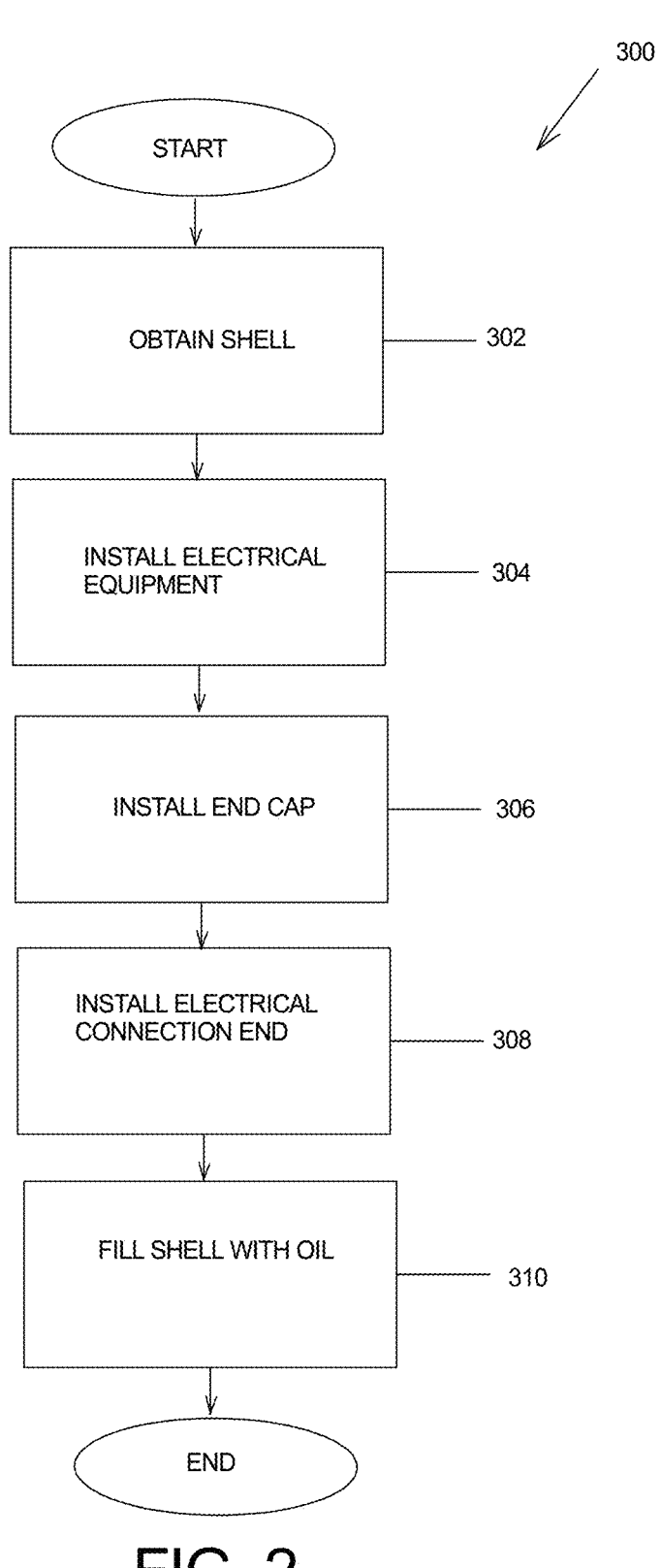
FIG. 2 is a method for assembling the arrangement.

Referring to FIG. 2, a method for an example embodiment of the disclosure is presented. The method 300 presented provides a method of cooling and maintaining electrical components in subsea applications. The method 300 may include obtaining a shell with a first end and a second end at 302. At 304, electrical equipment may be installed within the shell. At 306, the method may further comprise installing an end cap at the second end. At 308, the method may further comprise installing an electrical connection end at the first end, the electrical connection end configured to transmit electrical energy to the electrical equipment installed within the shell. At 310, the method may further comprise filling the shell with oil in order to cool and protect the electrical equipment within the shell.

In another example embodiment, an arrangement is disclosed. The arrangement may comprise a shell comprising an internal volume, the shell having a first end and a second end. The arrangement may also comprise an electrical connection end connected to the first end of the shell, the electrical connection end configured to transmit electricity and signals. The arrangement may also comprise an electronics rack positioned within the internal volume, the electronics rack configured to support electrical equipment and an end cap positioned at the second end of the shell, wherein a combination of the shell, the electrical connection and the end cap is configured to store oil within the combination.

In another example embodiment, the arrangement may be configured wherein the arrangement is made of carbon steel.

In another example embodiment, the arrangement may be configured wherein the arrangement is made of metallic materials.

In another example embodiment, the arrangement may be configured wherein the arrangement is made of titanium.

In another example embodiment, the arrangement may be configured wherein the electronics rack is configured to at least one of provide electricity from the electrical connection end and the send and receive signals to electronics stored on the electronics rack.

Another example embodiment of the disclosure provides a method. The method may comprise obtaining a shell with a first end and a second end and installing electrical equipment within the shell. The method may also comprise installing an end cap at the second end of the shell. The method may also comprise installing an electrical connection end at first end of the shell and filling the shell with oil.

In another example embodiment, the method may be performed The wherein the oil is configured to at least one of cool and protect the electrical equipment installed within the shell.

In another example embodiment, the method may be performed wherein the electrical connection end is configured to transmit electrical energy to the electrical equipment within the shell.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may be varied in many ways. Such variations are not to be regarded as a departure from the disclosure, and all such modifications are intended to be included within the scope of the disclosure.

While embodiments have been described herein, those skilled in the art, having benefit of this disclosure, will appreciate that other embodiments are envisioned that do not depart from the inventive scope. Accordingly, the scope of the present claims or any subsequent claims shall not be unduly limited by the description of the embodiments described herein.

What is claimed is:

1. An arrangement, comprising:
a shell comprising an internal volume, the shell having a first end and a second end;
oil disposed in the internal volume;
an electrical connection end connected to the first end of the shell, the electrical connection end configured to transmit electricity and signals;
an electronics rack extending centrally within the internal volume such that a majority of the oil radially surrounds the electronics rack between the electronics rack and the shell, the electronics rack configured to support electrical equipment, wherein:
the electronics rack comprises a first elongate member extending longitudinally through the internal volume from the first end to the second end and a second elongate member extending longitudinally through the internal volume from the first end to the second end; and
the electrical equipment comprises a plurality of spaced apart electrical components extending between and coupled to the first elongate member and the second elongate member; and an end cap positioned at the second end of the shell, wherein a combination of the shell, the electrical connection end, and the end cap is configured to store the oil within the combination, wherein the electronics rack is configured to at least one of provide the electricity from the electrical connection end and send and receive the signals to electronics stored on the electronics rack.

2. The arrangement according to claim 1, wherein the shell comprises carbon steel.

3. The arrangement according to claim 1, wherein the shell comprises metallic materials.

4. The arrangement according to claim 1, wherein the shell comprises titanium.

5. An arrangement, comprising:
a shell comprising an internal volume, the shell having a first end and a second end;
oil disposed in the internal volume;
an electrical connection end connected to the first end of the shell, the electrical connection end configured to transmit electricity and signals;
an electronics rack positioned within the internal volume, the electronics rack configured to support electrical equipment, wherein:
the electronics rack is centrally positioned within the internal volume such that a majority of the oil is disposed between the electronics rack and the shell;
the electronics rack comprises a first elongate member extending longitudinally through the internal volume from the first end to the second end and a second elongate member extending longitudinally through the internal volume from the first end to the second end; and
the electrical equipment comprises a plurality of spaced apart electrical components extending between and coupled to the first elongate member and the second elongate member; and
an end cap positioned at the second end of the shell, wherein a combination of the shell, the electrical connection end, and the end cap is configured to store the oil within the combination.

6. The arrangement according to claim 5, wherein the shell comprises carbon steel.

7. The arrangement according to claim 5, wherein the shell comprises a metallic material.

8. The arrangement according to claim 5, wherein the shell comprises titanium.

9. The arrangement according to claim 5, wherein the electronics rack is configured to at least one of provide the electricity from the electrical connection end or send and receive the signals to electronics stored on the electronics rack.

10. The arrangement according to claim 5, wherein the first elongate member and the second elongate member extend across an entirety of the internal volume between the first end and the second end.

11. The arrangement according to claim 5, wherein the first elongate member extends substantially parallel to the second elongate member.

12. The arrangement according to claim 10, wherein the first elongate member is spaced apart from the second elongate member.

13. A method, comprising:
obtaining a shell comprising a first end and a second end;
installing electrical equipment on an electronics rack within the shell, wherein:
the electronics rack comprises a first elongate member extending longitudinally from the first end to the second end and a second elongate member extending longitudinally from the first end to the second end; and the electrical equipment comprises a plurality of spaced apart electrical components extending between and coupled to the first elongate member and the second elongate member;

installing an end cap at the second end of the shell;

installing an electrical connection end at the first end of the shell; and filling the shell with oil, a majority of the oil radially surrounding the electrical equipment between the electrical equipment and the shell.

14. The method according to claim 13, wherein the oil is configured to at least one of cool or protect the electrical equipment installed within the shell.

15. The method according to claim 13, wherein the electrical connection end is configured to transmit electrical energy to the electrical equipment within the shell.

* * * * *